(12) United States Patent
Kim et al.

(10) Patent No.: US 11,545,358 B2
(45) Date of Patent: Jan. 3, 2023

(54) METHOD OF FORMING TRANSITION METAL DICHALCOGENIDE THIN FILM

(71) Applicants: Samsung Electronics Co., Ltd., Suwon-si (KR); RESEARCH & BUSINESS FOUNDATION SUNGKYUNKWAN UNIVERSITY, Gyeonggi-do (KR)

(72) Inventors: Changhyun Kim, Seoul (KR); Sang-Woo Kim, Yongin-si (KR); Kyung-Eun Byun, Seongnam-si (KR); Hyeonjin Shin, Suwon-si (KR); Ahrum Sohn, Pyeongtaek-si (KR); Jaehwan Jung, Daejeon (KR)

(73) Assignees: Samsung Electronics Co., Ltd., Gyeonggi-do (KR); Research & Business Foundation Sungkyunkwan University, Gyeonggi-do (KR)

( * ) Notice: Subject to any disclaimer, the term of this patent is extended or adjusted under 35 U.S.C. 154(b) by 225 days.

(21) Appl. No.: 16/851,675

(22) Filed: Apr. 17, 2020

(65) Prior Publication Data
US 2021/0043452 A1 Feb. 11, 2021

(30) Foreign Application Priority Data
Aug. 5, 2019 (KR) .................. 10-2019-0095165

(51) Int. Cl.
*H01L 21/00* (2006.01)
*H01L 21/02* (2006.01)

(52) U.S. Cl.
CPC .... *H01L 21/02568* (2013.01); *H01L 21/0242* (2013.01); *H01L 21/02376* (2013.01);
(Continued)

(58) Field of Classification Search
CPC ......... H01L 21/02568; H01L 21/02376; H01L 21/02417; H01L 21/0242; H01L 21/02488; H01L 21/02631
See application file for complete search history.

(56) References Cited

U.S. PATENT DOCUMENTS 9,963,343 B2 5/2018 Kim et al.
2018/0269059 A1* 9/2018 Lin .................. H01L 29/78681
(Continued)

FOREIGN PATENT DOCUMENTS

KR 10-2017-0107323 A 9/2017
KR 101800363 B1 11/2017
(Continued)

*Primary Examiner* — Richard A Booth
(74) *Attorney, Agent, or Firm* — Harness, Dickey & Pierce P.L.C.

(57) ABSTRACT

Disclosed herein are a method of forming a transition metal dichalcogenide thin film and a method of manufacturing a device including the same. The method of forming a transition metal dichalcogenide thin film includes: providing a substrate in a reaction chamber; depositing a transition metal dichalcogenide thin film on the substrate using a sputtering process that uses a transition metal precursor and a chalcogen precursor and is performed at a first temperature; and injecting the chalcogen precursor in a gas state and heat-treating the transition metal dichalcogenide thin film at a second temperature that is higher than the first temperature. The substrate may include a sapphire substrate, a silicon oxide ($SiO_2$) substrate, a nanocrystalline graphene substrate, or a molybdenum disulfide ($MoS_2$) substrate.

15 Claims, 9 Drawing Sheets

(52) U.S. Cl.
CPC .. *H01L 21/02417* (2013.01); *H01L 21/02488* (2013.01); *H01L 21/02631* (2013.01)

(56) References Cited

U.S. PATENT DOCUMENTS

| | | |
|---|---|---|
| 2018/0308692 A1 | 10/2018 | Muratore et al. |
| 2019/0103488 A1* | 4/2019 | Hung ................ H01L 29/78684 |
| 2019/0164754 A1 | 5/2019 | Kim et al. |

FOREIGN PATENT DOCUMENTS

| | | |
|---|---|---|
| KR | 101809251 B1 | 12/2017 |
| KR | 10-2019-0063064 A | 6/2019 |

* cited by examiner

METHOD OF FORMING TRANSITION METAL DICHALCOGENIDE THIN FILM

CROSS-REFERENCE TO RELATED APPLICATION

This application claims the benefit of Korean Patent Application No. 10-2019-0095165, filed on Aug. 5, 2019, in the Korean Intellectual Property Office, the disclosure of which is incorporated herein in its entirety by reference.

BACKGROUND

1. Field

The present disclosure relates to a method of forming a transition metal dichalcogenide thin film.

2. Description of Related Art

Graphene is a representative two-dimensional material having excellent mechanical, thermal, and electrical properties. However, graphene has a fundamental limitation in its application to electronic devices and optical devices due to the absence of an energy bandgap.

Transition Metal Dichalcogenide (TMD) has recently been proposed as a two-dimensional material to replace graphene. Transition metal dichalcogenide is generally represented by Chemical Formula of $MX_2$. In this case, M is a transition metal element such as Mo, W, or Ti, and X is a chalcogen element such as S, Se, or Te.

In principle, transition metal dichalcogenide performs only a two-dimensional interaction with constituent atoms. Accordingly, the transport of carriers in transition metal dichalcogenide exhibits an aspect of ballistic transport, unlike conventional thin films or bulks, thereby realizing high mobility, high speed, and low power characteristics. In addition, since the thickness of transition metal dichalcogenide, as the thickness of an atomic layer, is very thin, the transition metal dichalcogenide has flexible and transparent properties, and exhibits various electrical properties like semiconductors or conductors.

In particular, since transition metal dichalcogenide having semiconductor properties has an appropriate band gap and exhibits an electron mobility of several hundreds of $cm^2/V \cdot s$, the transition metal dichalcogenide is suitable for application to semiconductor devices such as transistors and has great potential for flexible transistor devices in the future.

Recently, methods of producing such a transition metal dichalcogenide nano film have been actively studied. In order to apply such a transition metal chalcogenide thin film as the above device, for example, methods of synthesizing a thin film uniformly and continuously in a large area have been studied.

SUMMARY

According to an embodiment, a method of forming a transition metal dichalcogenide thin film includes: providing a substrate in a reaction chamber; depositing a transition metal dichalcogenide thin film on the substrate using a sputtering process that uses a transition metal precursor and a chalcogen precursor and is performed at a first temperature; and injecting the chalcogen precursor in a gas state and heat-treating the transition metal dichalcogenide thin film at a second temperature higher than the first temperature. The substrate may include a sapphire substrate, a silicon oxide ($SiO_2$) substrate, a nanocrystalline graphene substrate, or a molybdenum disulfide ($MoS_2$) substrate.

In some embodiments, the substrate may include an oxide film and an antioxidant film on the oxide film.

In some embodiments, the antioxidant film may include at least one of graphene, h-BN, phosphorene, $SnS_2$, SiN, and $WSe_2$.

In some embodiments, the second temperature film may be about 800° C. to about 1200° C.

In some embodiments, a process pressure for the heat-treating the transition metal dichalcogenide thin film may be about 1 torr to about 10 torr.

In some embodiments, the first temperature may be about 500° C. to about 800° C.

In some embodiments, a deposition time for the depositing the transition metal dichalcogenide thin film on the substrate may be about 30 seconds to about 60 seconds.

In some embodiments, a deposition pressure for the depositing the transition metal dichalcogenide thin film on the substrate may be about 0.1 mTorr to about 10 mTorr.

In some embodiments, the transition metal dichalcogenide thin film may include at least one of an amorphous material and a polycrystalline material.

In some embodiments, the transition metal dichalcogenide thin film may include a composition represented by Formula 1 below:

$$MX_{(2-a)}Y_a \qquad \text{[Formula 1]}$$

wherein, in Formula 1 above, M may be a transition metal element, X may be a chalcogen element, Y may be a noise element, and $0 \leq a < 2$ may be satisfied.

In some embodiments, the heat-treating the transition metal dichalcogenide thin film may provide a heat-treated transition metal dichalcogenide thin film. The heat-treated transition metal dichalcogenide thin film may include a composition represented by Formula 2 below:

$$MX_2 \qquad \text{[Formula 2]}$$

wherein, in Formula 2 above, M may be a transition metal element, and X may be a chalcogen element.

In some embodiments, the transition metal precursor may include at least one of Ti, Zr, Hf, V, Nb, Ta, Mo, W, Tc, Re, Co, Rh, Ir, Ni, Pd, Pt, Zn, and Sn.

In some embodiments, the chalcogen precursor may include at least one of S, Se, and Te.

In some embodiments, the transition metal dichalcogenide thin film may be a single layer or multiple layers.

According to example embodiments, a method of forming a thin film of transition metal dichalcogenide is provided. The method may include providing a substrate in a reaction chamber, depositing a transition metal dichalcogenide thin film on the substrate using a physical vapor deposition process that uses a transition metal precursor and a chalcogen precursor and is performed at a first temperature, and injecting the chalcogen precursor in a gas state and heat-treating the transition metal dichalcogenide thin film at a second temperature that is higher than the first temperature. The substrate may include a sapphire substrate, a silicon oxide ($SiO_2$) substrate, a nanocrystalline graphene substrate, or a molybdenum disulfide ($MoS_2$) substrate.

In some embodiments, the transition metal precursor may include at least one of Ti, Zr, Hf, V, Nb, Ta, Mo, W, Tc, Re, Co, Rh, Ir, Ni, Pd, Pt, Zn, and Sn, and the chalcogen precursor may include at least one of S, Se, and Te.

In some embodiments, the substrate may include an antioxidant film.

In some embodiments, the antioxidant film may include at least one of graphene, h-BN, phosphorene, $SnS_2$, SiN, and $WSe_2$.

In some embodiments, the first temperature may be about 500° C. to about 800° C., the second temperature may be about 800° C. to about 1200° C., a process pressure for the heat-treating the transition metal dichalcogenide thin film may be about 1 torr to about 10 torr, and a deposition pressure for the depositing the transition metal dichalcogenide thin film may be about 0.1 mTorr to about 10 mTorr.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a method of forming a transition metal dichalcogenide thin film according to embodiments, and a method of manufacturing a device including the same will be described in detail with reference to the accompanying drawings. The width and thickness of the layers or regions shown in the accompanying drawings may be exaggerated for clarity and convenience of description. Like numbers refer to like elements throughout the specification.

The terminologies used herein are only for the purpose of describing particular exemplary embodiments, and are not intended to restrict the present inventive concepts. The singular forms "a," "an" and "the" are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

In the drawings, thicknesses are enlarged or reduced in order to clearly express various layers and regions. Like parts are designated by like reference numerals throughout the specification. In the entire specification, when a part of a layer, film, region, plate, etc. is said to be "on" or "over" another part, it includes not only being directly on another part but also having another part therebetween. In the entire specification, although the terms "first," "second," etc. may be used herein to describe various elements, these elements should not be limited by these terms. These terms are only used to distinguish one element from another element.

Although the terms "first," "second," etc. may be used herein to describe various elements, components, regions and/or layers, these elements, components, regions and/or layers should not be limited by these terms.

Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; C; A and B; A and C; B and C; and A, B, and C."

In addition, processes described in the present application do not necessarily mean that they are applied in order. For example, it will be understood that when steps 1 and 2 are described, step 1 does not necessarily have to be performed before step 2.

In example embodiments, a thin film of transition metal dichalcogenide may be formed using a physical vapor deposition process and a heat-treating process. Hereinafter, examples where the physical vapor deposition process includes a sputtering process are described, but inventive concepts are not limited thereto.

Figure 1:
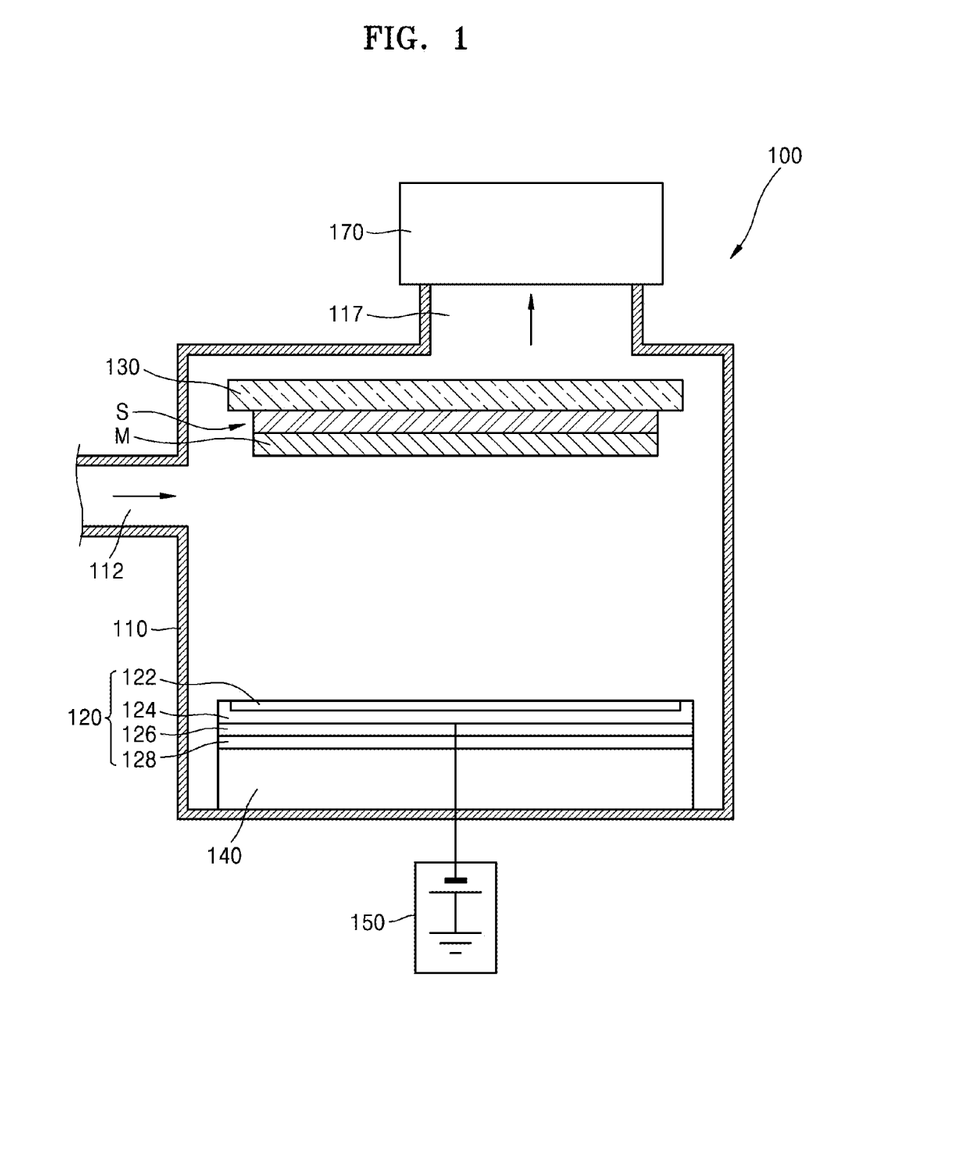
FIG. 1 is a schematic view of a sputtering apparatus according to an embodiment.

FIG. 1 is a schematic view of a sputtering apparatus according to an embodiment. Referring to FIG. 1, a sputtering apparatus 100 may include a reaction chamber 110 providing a space for a sputtering process, a target unit 120 disposed in the reaction chamber 110 and mounted with a material to be deposited on a substrate S, a substrate mounting unit 130 disposed to face the target unit 120 and mounting the substrate S provided with an antioxidant film M, and a pump 170 connected to an exhaust outlet 117 of the reaction chamber 110.

The reaction chamber 110 may provide a space for performing a sputtering process and a deposition process, may further include a gas inlet 112 supplying reaction gas for generating plasma between a target 122 and the substrate mounting unit 130 and an exhaust outlet 117 for exhausting residual reaction gas, and may easily exhaust residual reaction gas without a separate exhaust pump by connecting the exhaust outlet 117 to the pump 170 for controlling the pressure in the reaction chamber 110. Here, the reaction gas may be argon (Ar) gas capable of generating plasma at low power to limit and/or prevent damage to the substrate S mounted on the substrate mounting unit 130.

The substrate mounting unit 130 mounts the substrate S and supports the substrate S to face the target unit 120.

A target transport unit 140 may transport the target unit 120, thereby inducing uniform sputtering on the substrate S. The target transport unit 140 may move the target unit 120 horizontally or vertically or may rotate the target unit 120.

Meanwhile, the target unit 120 is disposed in a region facing the substrate S in the reaction chamber 110. The target unit 120 may be disposed in parallel to the substrate S while facing the substrate S. The target unit 120 may include a target 122, a target plate 124, a negative electrode plate 126, and a magnet 128.

The target 122 collides with ions in the reaction chamber 110 generated by the acceleration of electrons, thereby causing a sputtering phenomenon in which a material on the surface of the target 122 is released. The material released from the surface of the target 122 may be formed on the substrate S or the antioxidant film M to form a thin film (not shown). The target 122 may include a precursor including a transition metal and chalcogen. A transition metal dichalcogenide thin film TMD may be formed by and/or using the precursor.

The target plate 124 fixes the target 122 that is a supply source of the deposition material formed on the substrate S by sputtering. The negative electrode plate 126 is disposed on the target plate 124, and is connected to a power supply unit 150 to apply a voltage to the target 122. In addition, the magnet 128 applies a magnetic field to limit and/or prevent electrons generated in the plasma from escaping to other parts of the sputtering apparatus 100.

The power supply unit 150 is connected to the negative electrode plate 126 in the reaction chamber 110, thereby generating plasma between the substrate S and the target 122. In this case, the amount of input power may be about 20 W to about 60 W.

Although one target unit is shown in the drawings, the present disclosure is not limited thereto. A plurality of target units may be provided. One target unit may be provided with a transition metal precursor, and another target unit may be provided with a chalcogen precursor. Different voltages from each other may be applied to the respective target units.

Figure 2:
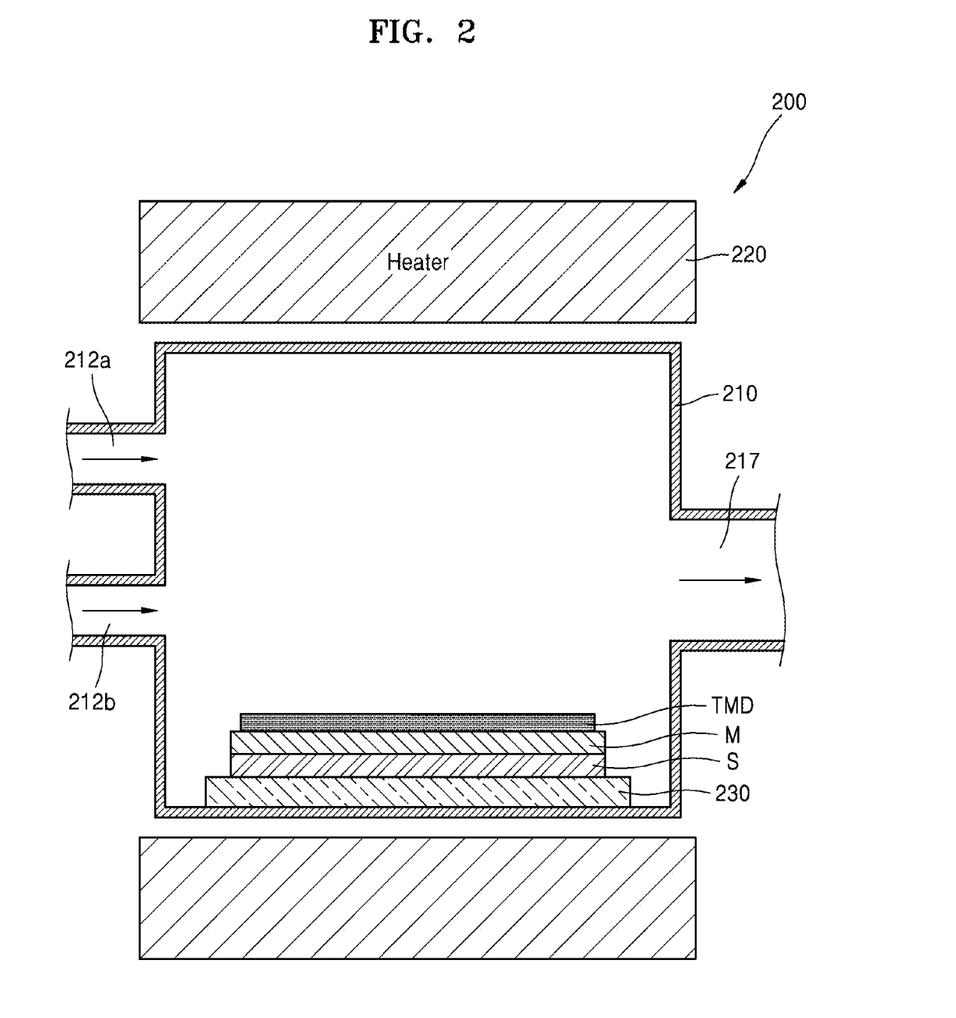
FIG. 2 is a schematic view of a heat treatment apparatus according to an embodiment.

FIG. 2 is a schematic view of a heat treatment apparatus according to an embodiment. Referring to FIG. 2, a heat treatment apparatus 200 may include a chamber 210 for providing a space, and a heater 220 for heating the space in the chamber 210. The chamber 210 may include gas inlets 212a and 212b for supplying reaction gas to the space in the chamber 210, an exhaust outlet 217 for exhausting residual reaction gas, and a substrate mounting unit 239 for mounting a substrate. Although it is shown in the drawings that a substrate is disposed in the chamber 210 of the heat treatment apparatus 200, inventive concepts are not limited thereto. The substrate may be disposed, thereby completing the space in the chamber.

Figure 3:
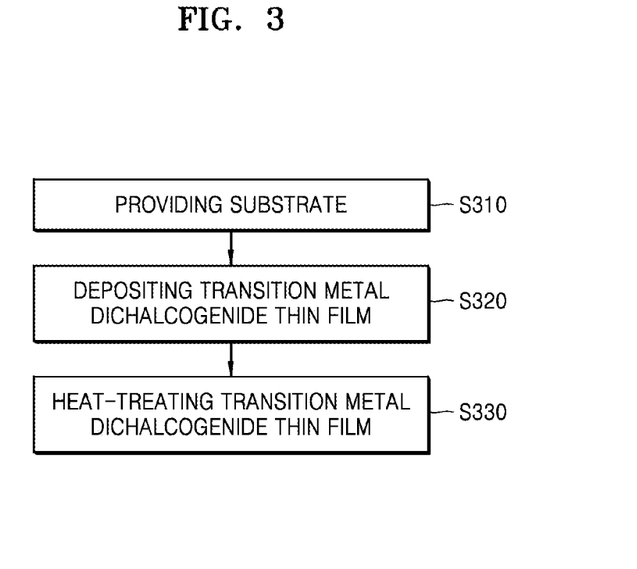
FIG. 3 is a flowchart illustrating a method of forming a transition metal dichalcogenide thin film, according to an embodiment.
Figure 4A:
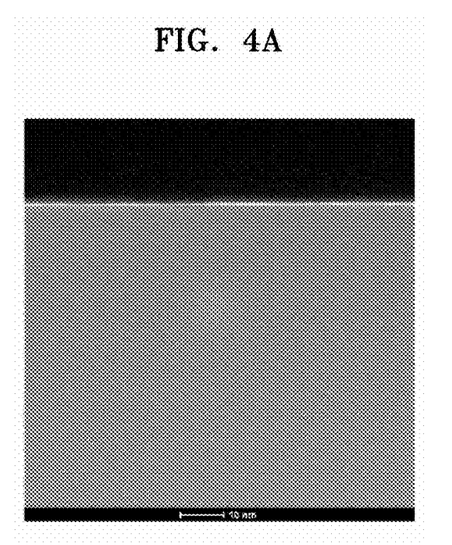
FIGS. 4A to 4D are TEM sectional photographs showing a laminate structure in which a transition metal dichalcogenide thin film is formed on a sapphire substrate, a silicon oxide ($SiO_2$) substrate, a nanocrystalline graphene substrate, and a molybdenum disulfide ($MoS_2$) substrate according to an embodiment of the present disclosure.
Figure 4B:
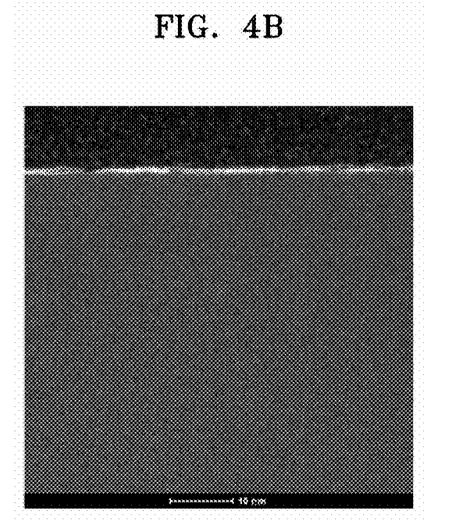
Figure 4C:
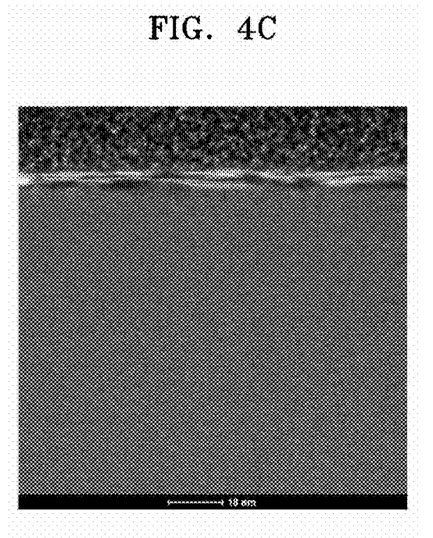
Figure 4D:
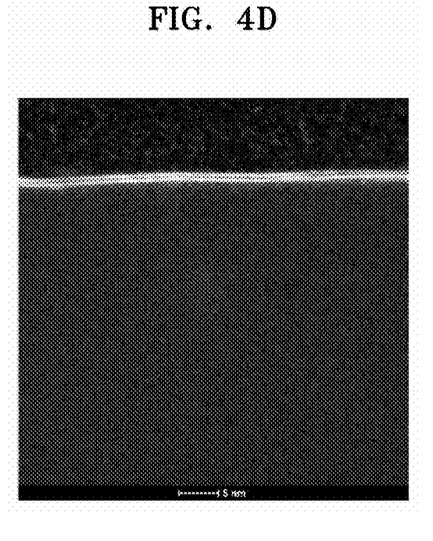

FIG. 3 is a flowchart illustrating a method of forming a transition metal dichalcogenide thin film, according to an embodiment. FIGS. 4A to 4D are TEM sectional photographs showing a laminate structure in which a transition metal dichalcogenide thin film is formed on a sapphire substrate, a silicon oxide ($SiO_2$) substrate, a nanocrystalline graphene substrate, and a molybdenum disulfide ($MoS_2$) substrate according to an embodiment of the present disclosure.

Referring to FIG. 3, a substrate S is provided on a substrate mounting unit of a reaction chamber (S310). The substrate S may be a substrate capable of growing a transition metal dichalcogenide thin film. For example, the substrate S for growing the transition metal dichalcogenide thin film may be a sapphire substrate, a silicon oxide ($SiO_2$) substrate, a nanocrystalline graphene substrate, or a molybdenum disulfide ($MoS_2$) substrate, as shown in FIGS. 4A to 4D. However, the present disclosure is not limited thereto, and the substrate S may include at least one selected from silicon, aluminum oxide, magnesium oxide, silicon carbide, silicon nitride, glass, quartz, graphite, a polyimide copolymer, polyimide, polyethylene naphthalate (PEN), a fluoropolymer (FEP), and polyethylene terephthalate (PET).

Further, according to an embodiment of the present disclosure, an antioxidant film M capable of limiting and/or preventing the oxidation of the transition metal dichalcogenide thin film may be disposed on the substrate S. For example, the transition metal dichalcogenide thin film TMD may be oxidized on the substrate S formed of an oxide film due to the introduction of oxygen in the process of growing the transition metal dichalcogenide thin film TMD. In order to limit and/or prevent the oxidation of such a transition metal dichalcogenide thin film TMD, the antioxidant film M may be disposed on the substrate S. For example, the antioxidant film M may include at least one of graphene, h-BN, phosphorene, $SnS_2$, SiN, and $WSe_2$, but the present disclosure is not limited thereto. Further, a sputtering process may be performed in a state in which an additional antioxidant film M is not disposed on the substrate S.

As shown in FIG. 1, reaction gas such as argon (Ar) gas may be supplied to the space in the reaction chamber 110 through the gas inlet 112. Another gas such as oxygen or nitrogen gas other than argon (Ar) gas may be injected into the reaction chamber 110. In this case, the pressure in the reaction chamber 110 may be about 0.1 mTorr to about 10 mTorr. Further, the temperature of the substrate S disposed in the reaction chamber 110 may be about 500° C. to 800° C.

Next, power is applied to a target to form a transition metal dichalcogenide thin film on the substrate S through a sputtering process (S320). The power applied to the target may be about 20 W to about 60 W. The target may include a precursor of a transition metal and chalcogen. For example, the target may be two or more kinds of precursors including at least one transition metal precursor and at least one chalcogen precursor. The precursor may be a powder-type precursor.

The transition metal precursor may include at least one element selected from Ti, Zr, Hf, V, Nb, Ta, Mo, W, Tc, Re, Co, Rh, Ir, Ni, Pd, Pt, Zn, and Sn. For example, the transition metal precursor may include a metal oxide, a metal halide, a metal carbonyl compound, each containing the element, or a combination thereof.

The chalcogen precursor may include at least one element selected from S, Se, and Te. The chalcogen precursor, for example, may include at least one selected from sulfur, hydrogen sulfide ($H_2S$), diethyl sulfide, dimethyl disulfide, ethyl methyl sulfide, $(Et_3Si)_2S$, hydrogen selenide ($H_2Se$), diethyl selenide, dimethyl diselenide, ethyl methyl selenide, $(Et_3Si)_2Se$, hydrogen telluride ($H_2Te$), dimethyl telluride, diethyl telluride, ethyl methyl telluride, and $(Et_3Si)_2Te$.

When a voltage is applied to the target including the transition metal precursor and the chalcogen precursor through the power supply unit 150, sputtering plasma is generated in the reaction chamber 110. In this case, the plasma is composed of gamma-electrons, anions, cations, and the like. The sputtering plasma collides with the target, and the material sputtered from the target is deposited on the substrate S, thereby forming a thin film.

The thin film formed by sputtering may include a composition represented by Formula 1 below.

$$MX_{2-a}Y_a \qquad [\text{Formula 1}]$$

In Formula 1 above, M is a transition metal element, X is a chalcogen element, Y is another element (hereinafter, referred to as "noise element") other than the transition metal and the chalcogen element, and 0<a<2 is satisfied.

The transition metal element, for example, may be selected from Ti, Zr, Hf, V, Nb, Ta, Mo, W, Tc, Re, Co, Rh, Ir, Ni, Pd, Pt, Zn, and Sn. Specifically, the transition metal element, for example, may be Mo, W, V, or Nb. The chalcogen element, for example, may be selected from S, Se, and Te. The noise element is an element other than the transition metal and the chalcogen element, and may be an element such as O, N, or Ar existing in the reaction chamber, or may be an element such as O, CO, C, or H included in the chalcogen precursor. The thin film formed by the above sputtering may be referred to as a transition metal dichalcogenide thin film TMD.

The thickness of the transition metal dichalcogenide thin film TMD may be determined by the energy reaction rate of the sputtered material formed through the size of input power applied to the target, the time during which the input power is applied, process pressure, and substrate temperature. For example, the greater the energy reaction rate of the sputtered material, the greater the thickness of the transition metal dichalcogenide thin film TMD. The transition metal dichalcogenide thin film TMD may be formed in a single layer structure or a multilayer structure of two to four layers.

As described above, the transition metal dichalcogenide thin film TMD may be uniformly deposited on a wide substrate because it is deposited by particles sputtered from the target 122. Further, the thickness of the transition metal dichalcogenide thin film TMD may also be easily adjusted because the energy reaction rate of the sputtered material may be easily adjusted by adjusting the size of input power and the application time of input power.

In addition, the transition metal dichalcogenide thin film TMD formed by sputtering may include an amorphous material or any polycrystalline material because it is deposited at low temperatures. Further, the sputtered particles may include elements other than transition metals and chalcogen elements included in the precursor, and may be bonded to oxygen or nitrogen existing in the reaction chamber while the sputtered particles are moved from the target to the substrate S. Thus, the transition metal dichalcogenide thin film TMD formed by sputtering may include noise elements other than the transition metal and chalcogenide.

Next, the transition metal dichalcogenide thin film TMD formed by sputtering may be heat-treated (S330). The substrate S, on which the transition metal dichalcogenide thin film TMD is deposited, may be moved from the sputtering apparatus to the heat treatment apparatus. The heat treatment apparatus may generally have a narrower reaction space than the sputtering apparatus. The substrate S on which the transition metal chalcogenide thin film TMD is deposited may be disposed or mounted inside the heat treatment apparatus, thereby completing a reaction space of the heat treatment apparatus. The heat treatment apparatus may heat-treat the transition metal dichalcogenide thin film TMD using a heater 220. As an example, during the heat treatment, process pressure may be about 1 torr to about 10 torr, and a heat treatment temperature may be about 800° C. to about 1200° C.

The chalcogen precursor may be further injected into the reaction space of the heat treatment apparatus. For example, the chalcogen precursor may be injected into the reaction space in a gaseous phase, such as hydrogen sulfide ($H_2S$) gas, to maintain a constant concentration regardless of the location of the substrate surface. The transition metal dichalcogenide thin film TMD may be crystallized by heat-treating the transition metal dichalcogenide thin film TMD. Further, since the noise element is separated from the transition metal dichalcogenide thin film TMD by heat treatment, the purity of the transition metal dichalcogenide thin film TMD may be increased. The chalcogen element may be replaced at the site of the separated noise element.

The heat-treated transition metal dichalcogenide thin film TMD may include a composition represented by Formula 2 below.

$$MX_2 \qquad [\text{Formula 2}]$$

In Formula 2 above, M is a transition metal element, and X is a chalcogen element.

The transition metal element may be selected from Ti, Zr, Hf, V, Nb, Ta, Mo, W, Tc, Re, Co, Rh, Ir, Ni, Pd, Pt, Zn, and Sn. Specifically, the transition metal element may be Mo, W, V, or Nb. The chalcogen element may be selected from S, Se, and Te. As a specific example, the transition metal dichalcogenide thin film may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, or $ReSe_2$.

In the case where the precursor includes a material of a lower group than transition metals and chalcogens, when the transition metal dichalcogenide thin film TMD deposited by the precursor is heat-treated, holes may be formed in transition metals or chalcogens while the above lower group materials are separated from the thin film.

The transition metal dichalcogenide thin film TMD may include a two-dimensional (2D) material. The two-dimensional material is a single-layered or half-layered solid in which atoms form a desired and/or alternatively predetermined crystal structure. The two-dimensional material may have a layered structure. Electronically, the two-dimensional material may be defined as a material whose density of state (DOS) follows a quantum well behavior. Since the DOS may also follow a quantum well behavior even in the material in which a plurality of two-dimensional unit material layers (a plurality of single layers) are stacked, in this regard, the structure in which the single layers are repeatedly stacked may also be referred to as a "two-dimensional material". The interlayers of two-dimensional materials may have van der Waals bonds.

The transition metal dichalcogenide thin film TMD formed according to the embodiment may further include a doping element A. For example, doping elements may be included in the precursor. In this case, the material of the transition metal dichalcogenide thin film TMD may represented by A-doped $MX_2$ or $AMX_2$. $AMX_2$ may be $A_xM_{1-x}X_2$. The doping element A may be a metal (e.g., a transition metal). The content of the doping element A may be about 5 wt % or less or about 3 wt % or less.

According to the above-described embodiments, a transition metal dichalcogenide thin film TMD having uniformity and high quality may be formed on various kinds of substrates in a large area in a short time by a sputtering process. Further, even when an antioxidant film is disposed on the specific substrate, a transition metal dichalcogenide thin film TMD having uniformity and high quality may be formed in a large area in a short time by a sputtering process according to an embodiment of the present disclosure. Further, the thickness of the transition metal dichalcogenide thin film TMD may be easily adjusted by a sputtering process.

Figure 5:
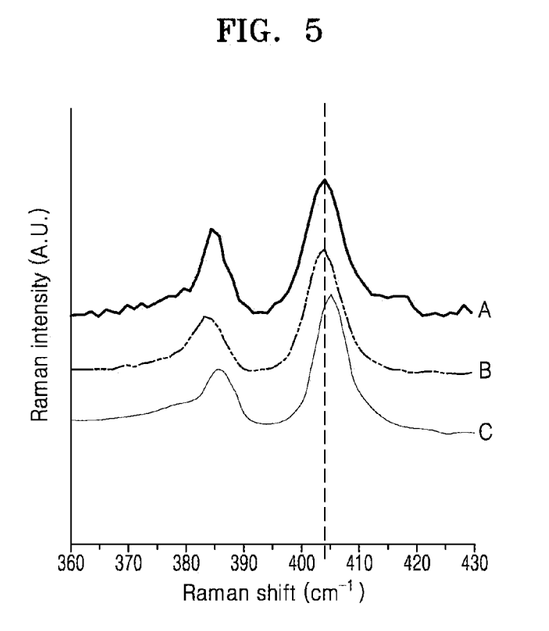
FIG. 5 is a graph showing the Raman spectrum analysis results of a laminate of a sapphire substrate and a molybdenum disulfide ($MoS_2$) substrate and a laminate of a sapphire substrate, a graphene antioxidant film and a molybdenum disulfide ($MoS_2$) substrate, the laminates being formed according to an embodiment, and showing the Raman spectrum analysis results of a laminate in which molybdenum disulfide ($MoS_2$) is deposited on a silicon oxide ($SiO_2$) substrate by high-temperature chemical vapor deposition.

FIG. 5 is a graph showing the Raman spectrum analysis results of a laminate of a sapphire substrate and a molybdenum disulfide ($MoS_2$) substrate and a laminate of a sapphire substrate, a graphene antioxidant film and a molybdenum disulfide ($MoS_2$) substrate, the laminates being formed according to an embodiment and showing the Raman spectrum analysis results of a laminate in which molybdenum disulfide ($MoS_2$) is deposited on a silicon oxide ($SiO_2$) substrate by high-temperature chemical vapor deposition.

In the case of a $MoS_2$ laminate deposited on an oxide film substrate, for example, a silicon oxide ($SiO_2$) substrate, presented as a comparative example, the $MoS_2$ laminate may be formed by high-temperature chemical vapor deposition. As an example, molybdenum (Mo), which is a transition metal as a first precursor material, is supplied into the reaction chamber, and sulfur (S), which is a chalcogen element as a second precursor material, is supplied into the reaction chamber. In this case, a catalytic gas may be further supplied together with the first and second precursor materials. The catalytic gas may include, for example, hydrogen ($H_2$) gas. The catalytic gas may, for example, remove the ethyl group of a chalcogen source, that is, a precursor of a chalcogen element. Therefore, a reaction between a chalcogen source and a metal source (that is, a precursor of a metal element) may be accelerated by the catalytic gas. The supplying of the precursor may have a period ranging from about 30 seconds to about 180 seconds, and the discharging of the precursor may have a period ranging from about 5 seconds to about 120 seconds While the supplying of the precursor and the discharging of the precursor are alternately performed, a $MoS_2$ layer may be grown on a silicon oxide ($SiO_2$) substrate. In this case, the reaction temperature for growth of the $MoS_2$ layer may be, for example, about 550° C. to about 1050° C.

In contrast, in the case of a $MoS_2$ laminate deposited on a sapphire substrate according to an embodiment of the present disclosure and a $MoS_2$ laminate deposited on a substrate further including a graphene layer as an antioxidant film on a silicon oxide substrate, the $MoS_2$ laminate may be formed by a sputtering process. As an example, the sapphire substrate and the substrate further including a graphene layer as an antioxidant film on the silicon oxide substrate are disposed in the reaction chamber 110, and then argon (Ar) is supplied into the reaction chamber 110 until the pressure in the reaction chamber 110 reaches about 0.1 mTorr to about 10 mTorr. Thereafter, power of about 20 W to about 60 W is applied to a target including molybdenum (Mo) as a transition metal and sulfur (S) as a chalcogen element for about 30 seconds to 60 seconds to grow a $MoS_2$ thin film. In this case, the temperature of the substrate may be about 500° C. to about 800° C. Next, the substrate on which the $MoS_2$ thin film is grown may be heat-treated to remove noise elements. Hydrogen sulfide ($H_2S$) gas may be further injected into the reaction space of the heat treatment apparatus as a chalcogen precursor. In this case, a heat treatment temperature may be about 800° C. to about 1200° C., and process pressure may be about 1 torr to about 10 torr.

Referring to FIG. 5, in the Raman graph of a $MoS_2$ laminate A formed on a sapphire substrate by a sputtering process according to an embodiment of the present disclosure and a $MoS_2$ laminate B formed on a silicon oxide substrate including a graphene layer as an antioxidant film, it may be found that peaks for $MoS_2$ are the same. Meanwhile, in the Raman graph of a $MoS_2$ laminate C deposited on a silicon oxide ($SiO_2$) substrate by high-temperature chemical vapor deposition presented as a comparative example, it may be found that a peak for $MoS_2$ moved. Thus, it may be found that a high-quality transition metal dichalcogenide thin film TMD not oxidized even on an antioxidant film may be formed by the sputtering method of the present disclosure.

Figure 6:
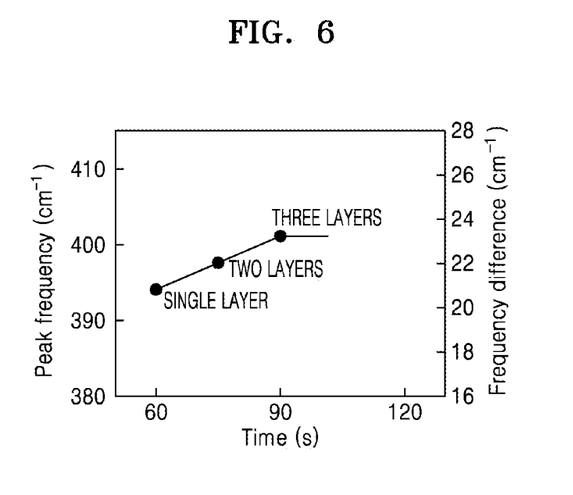
FIG. 6 is a view showing the Raman spectrum analysis results of the thickness of a thin film over sputtering time according to an embodiment.

FIG. 6 is a view showing the Raman spectrum analysis results of the thickness of a thin film over sputtering time according to an embodiment.

According to an embodiment of the present disclosure, power of about 20 W to about 60 W may be applied to a target including molybdenum (Mo) as a transition metal and sulfur (S) as a chalcogen element for about 30 seconds to 90 seconds. In this case, the temperature of the substrate may be about 500° C. to about 800° C. Next, the substrate, on which the $MoS_2$ thin film is grown, may be heat-treated to remove noise elements. Hydrogen sulfide ($H_2S$) gas may be further injected into the reaction space of the heat treatment apparatus as a chalcogen precursor. In this case, a heat treatment temperature may be about 800° C. to about 1200° C., and process pressure may be about 1 torr to about 10 torr.

Referring to FIG. 6, a peak frequency corresponding to the first layer of a transition metal dichalcogenide thin film TMD was observed at about 60 seconds after the start of a sputtering process, and a peak frequency corresponding to the second layer of the transition metal dichalcogenide thin film TMD was observed at about 75 seconds after the start of the sputtering process, Further, a peak frequency corresponding to the third layer of the transition metal dichalcogenide thin film TMD was observed at about 90 seconds after the start of the sputtering process. It may be found that the thickness of the transition metal dichalcogenide thin film TMD changes with the sputtering time. Although the transition metal dichalcogenide thin film may be formed through a chemical vapor deposition method, there is a difficulty in controlling the thickness. However, the thickness of the transition metal dichalcogenide thin film TMD by the sputtering process according to an embodiment may be easily adjusted by adjusting the sputtering time.

Figure 7A:
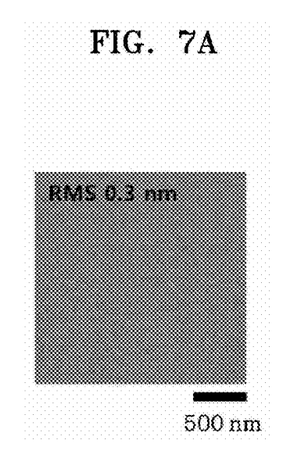
FIG. 7A is a planar image of a transition metal dichalcogenide thin film formed by a process according to an embodiment.
Figure 7B:
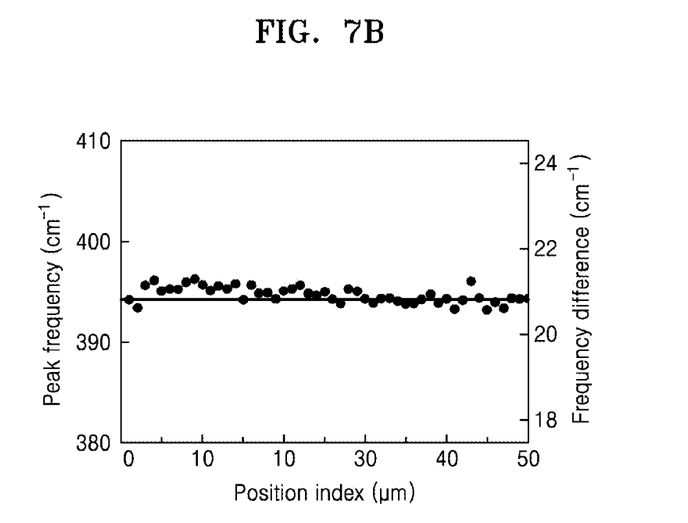
FIG. 7B is a view showing the Raman spectrum analysis results for the thickness of a transition metal dichalcogenide thin film formed by a process according to an embodiment.

FIG. 7A is a planar image of a transition metal dichalcogenide thin film formed by a process according to an embodiment. FIG. 7B is a view showing the Raman spectrum analysis results for the thickness of a transition metal dichalcogenide thin film formed by a process according to an embodiment.

According to an embodiment of the present disclosure, power of about 20 W to about 60 W may be applied to a target including molybdenum (Mo) as a transition metal and sulfur (S) as a chalcogen element for about 30 seconds to 60 seconds. In this case, the temperature of the substrate may be about 500° C. to about 800° C. Next, the substrate, on which the $MoS_2$ thin film is grown, may be heat-treated to remove noise elements. Hydrogen sulfide ($H_2S$) gas may be further injected into the reaction space of the heat treatment apparatus as a chalcogen precursor. In this case, a heat treatment temperature may be about 800° C. to about 1200° C., and process pressure may be about 1 torr to about 10 torr. As shown in FIGS. 7A and 7B, it may be found that in the $MoS_2$ thin film formed on a substrate, a relatively constant Raman peak is detected along the extension direction of the substrate, and thus a uniform substrate is formed.

Figure 8:
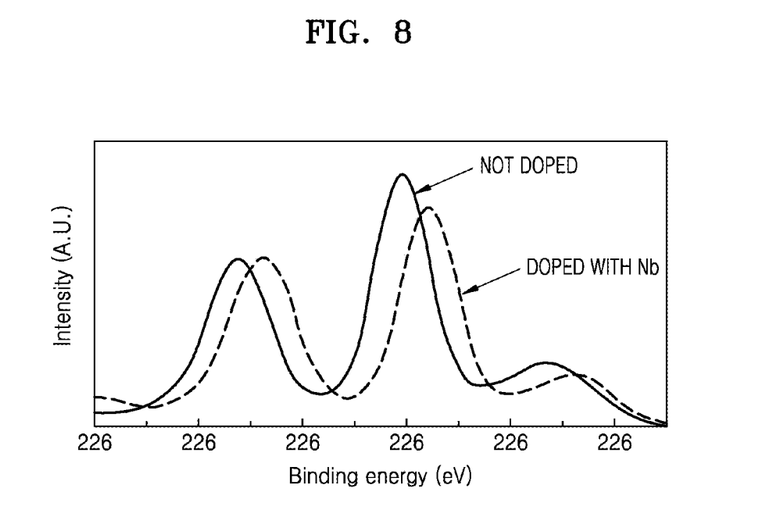
FIG. 8 is a view showing the experimental results of the formation of an undoped transition metal dichalcogenide thin film and a doped transition metal dichalcogenide thin film.

FIG. 8 is a view showing the experimental results of the formation of an undoped transition metal dichalcogenide thin film and a doped transition metal dichalcogenide thin film.

A first thin film was formed using a first precursor including Mo and S, and a second thin film was formed using a second precursor including Nb, Mo, and S. The specific gravity of Nb included in the second precursor was about 1%. It may be found that the binding energy of the second thin film was shifted compared to the binding energy of the first thin film. This means that the second thin film was doped. Thus, it may be found that a doped transition metal dichalcogenide thin film may be formed using a sputtering process.

In the conventional method, it is difficult to form a transition metal dichalcogenide thin film in a wafer scale, and it is difficult to secure uniformity of a continuous film. Although a method of using a metal organic precursor has been introduced to solve scalability problems, the time required to form a monolayer is about 26 hours, and thus this method is not commercially available. However, according to an embodiment of the present disclosure, the universal film uniformity can be secured, and a high-quality transition metal chalcogenide thin film may be formed in a short time through an easy process.

Figure 9:
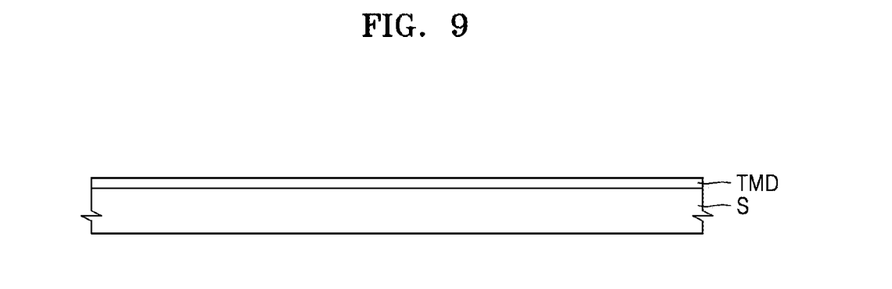
FIGS. 9 to 11 are cross-sectional views showing transition metal dichalcogenide thin films according to various embodiments.
Figure 10:
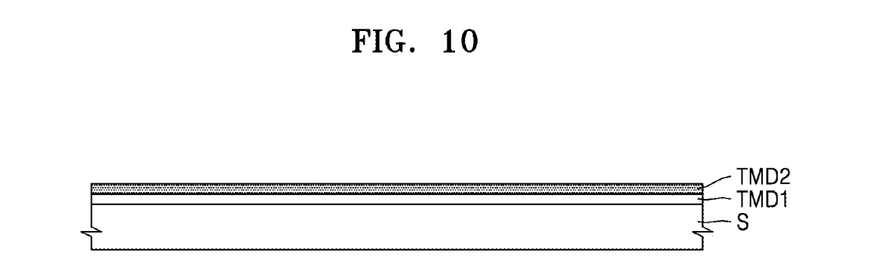
Figure 11:
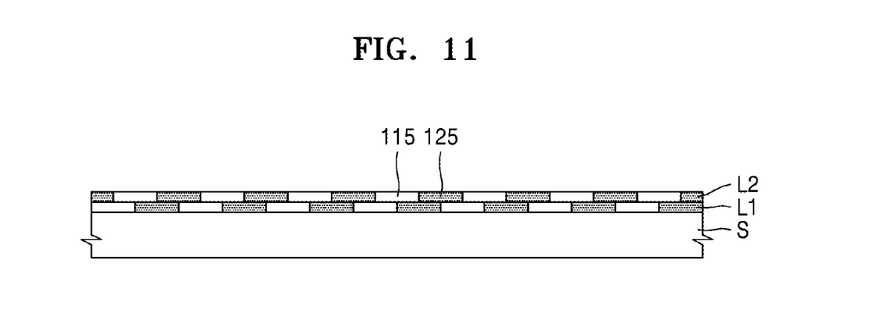

FIGS. 9 to 11 are cross-sectional views showing transition metal dichalcogenide thin films according to various embodiments.

Referring to FIG. 9, a transition metal dichalcogenide thin film TMD may be formed on a substrate S. The transition metal dichalcogenide thin film TMD may include, for example, $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, or $ReSe_2$. Although not illustrated, the antioxidant film M described in relation to FIGS. 1-2 may be provided between the transition metal dichalcogenide thin film TMD and the substrate S. In some embodiments, the antioxidant film M may be omitted.

Referring to FIG. 10, a plurality of different transition metal dichalcogenide materials may be applied on the substrate S in a multilayer structure. For example, a first transition metal dichalcogenide film TMD1 may be formed on the substrate S, and a second transition metal dichalcogenide film TMD2 may be formed on the first transition metal dichalcogenide film TMD1. The first transition metal dichalcogenide film TMD1 is formed using the method described with reference to FIG. 3, and then an additional thin film forming process is performed by changing a precursor material (source material), thereby forming the second transition metal dichalcogenide film TMD2, which is different from the first transition metal dichalcogenide film TMD1, on the first transition metal dichalcogenide film TMD1. The first transition metal dichalcogenide films TMD1 and the second transition metal dichalcogenide films TMD2 may be alternately stacked. Three or more kinds of transition metal chalcogenide thin films may be stacked in a desired order.

Referring to FIG. 11, a multilayered structure including a plurality of transition metal dichalcogenide materials different from each other may be formed on a substrate S. For example, a first layer structure L1 and a second layer structure L2 may be stacked on the substrate S. The first layer structure L1 may include a first transition metal dichalcogenide material region 115 and a second transition metal dichalcogenide material region 125. Further, the second layer structure L2 may include a first transition metal dichalcogenide material region 115 and a second transition metal dichalcogenide material region 125. The first and second layer structures L1 and L2 each including the first and second transition metal dichalcogenide material regions 115 and 125 may be formed by changing a precursor material (source material) while forming each of the first and second layer structures L1 and L2 using the method described with reference to FIG. 3. A multilayered structure including three or more layered structures may be formed, and three kinds of transition metal dichalcogenide materials may be applied. In addition, the formation method and resultant product of the transition metal chalcogenide thin film may be variously modified.

According to the aforementioned embodiment, it is possible to form transition metal chalcogenide thin films deposited on various substrates. Further, it is possible to easily form a transition metal dichalcogenide thin film having uniformity and high quality in a large area. Moreover, it is possible to form a transition metal dichalcogenide thin film of a wafer scale in a short time. In this regard, embodiments of the present disclosure may be advantageously applied to the development and commercialization of devices to which a transition metal chalcogenide thin film is applied.

As described above, the method of forming the transition metal dichalcogenide thin film may be applied to methods of manufacturing various devices (two-dimensional material-containing devices). The method of manufacturing a device (two-dimensional material-containing device) may include: forming a transition metal dichalcogenide thin film on a substrate using the aforementioned method; and forming a device including the transition metal dichalcogenide thin film. Here, various examples of the device (two-dimensional material-containing device) may include a transistor, a diode, an optoelectronic device, a tunneling device, a logic device, and a memory device. Various examples of the optoelectronic device may include a photoswitch, a photodetector, and a photovoltaic device. Further, the transition metal chalcogenide thin film according to the embodiment may also be applied as an intercalation layer between a metal and a semiconductor to control the contact properties between the metal and the semiconductor. In addition, the transition metal chalcogenide thin film according to the embodiment may also be applied for various purposes in various electronic device fields. Moreover, since the method of the embodiment is compatible with a Si-based process, it may be easily applied to the existing Si-based process and devices. When using the method of the embodiment, a transition metal dichalcogenide thin film may be easily formed with high throughput, and thus a device using the transition metal dichalcogenide thin film may be manufactured at high productivity and low cost.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of forming a thin film of transition metal dichalcogenide, the method comprising:
   providing a substrate in a reaction chamber,
   the substrate including a silicon oxide ($SiO_2$) substrate;
   depositing a transition metal dichalcogenide thin film on the substrate using a sputtering process that uses a transition metal precursor and a chalcogen precursor and is performed at a first temperature; and
   injecting the chalcogen precursor in a gas state and heat-treating the transition metal dichalcogenide thin film at a second temperature that is higher than the first temperature
   wherein the first temperature is about 500° C. to about 800° C. and the second temperature is about 800° C. to about 1200° C. and
   wherein a process pressure for the heat-treating the transition metal dichalcogenide thin film is about 1 torr to about 10 torr, and a deposition pressure for the depositing the transition metal dichalcogenide thin film on the substrate is about 0.1 mTorr to about 10 mTorr.

2. The method of claim 1, wherein
   the substrate includes an oxide film and an antioxidant film on the oxide film.

3. The method of claim 2, wherein the antioxidant film includes at least one of graphene, h-BN, phosphorene, $SnS_2$, SiN, and $WSe_2$.

4. The method of claim 1, wherein a deposition time for the depositing the transition metal dichalcogenide thin film on the substrate is about 30 seconds to about 60 seconds.

5. The method of claim 1, wherein the transition metal dichalcogenide thin film includes at least one of an amorphous material and a polycrystalline material.

6. The method of claim 1, wherein the transition metal dichalcogenide thin film includes a composition represented by Formula 1 below:

$$MX_{(2-a)}Y_a \qquad \text{[Formula 1]}$$

wherein, in Formula 1 above, M is a transition metal element, X is a chalcogen element, Y is a noise element, and
0≤a<2 is satisfied.

7. The method of claim 1, wherein
   the heat-treating the transition metal dichalcogenide thin film provides a heat-treated transition metal dichalcogenide thin film, and
   the heat-treated transition metal dichalcogenide thin film includes a composition represented by Formula 2 below:

$$MX_2 \qquad \text{[Formula 2]}$$

wherein, in Formula 2 above, M is a transition metal element, and
X is a chalcogen element.

8. The method of claim 1, wherein the transition metal precursor includes at least one of Ti, Zr, Hf, V, Nb, Ta, Mo, W, Tc, Re, Co, Rh, Ir, Ni, Pd, Pt, Zn, and Sn.

9. The method of claim 1, wherein the chalcogen precursor includes at least one of S, Se, and Te.

10. The method of claim 1, wherein the transition metal dichalcogenide thin film is a single layer or multiple layers.

11. A method of forming a thin film of transition metal dichalcogenide, the method comprising:
    providing a substrate in a reaction chamber,
    the substrate including a silicon oxide ($SiO_2$) substrate;
    depositing a transition metal dichalcogenide thin film on the substrate using a physical vapor deposition process that uses a transition metal precursor and a chalcogen precursor and is performed at a first temperature; and
    injecting the chalcogen precursor in a gas state and heat-treating the transition metal dichalcogenide thin film at a second temperature that is higher than the first temperature
    wherein the first temperature is about 500° C. to about 800° C. and the second temperature is about 800° C. to about 1200° C., and
    wherein a process pressure for the heat-treating the transition metal dichalcogenide thin film is about 1 torr to about 10 torr, and a deposition pressure for the depositing the transition metal dichalcogenide thin film is about 0.1 mTorr to about 10 mTorr.

12. The method of claim 11, wherein
    the transition metal precursor includes at least one of Ti, Zr, Hf, V, Nb, Ta, Mo, W, Tc, Re, Co, Rh, Ir, Ni, Pd, Pt, Zn, and Sn, and
    the chalcogen precursor includes at least one of S, Se, and Te.

13. The method of claim 11, wherein the substrate includes an antioxidant film.

14. The method of claim 13, wherein the antioxidant film includes at least one of graphene, h-BN, phosphorene, $SnS_2$, SiN, and $WSe_2$.

15. The method of claim 11, wherein
    a power of about 20 W to 60 W is applied to a target during the depositing the transition metal dichalcogenide thin film.

* * * * *